METHOD FOR DATA TRANSFER FOR A SEMICONDUCTOR MEMORY USING COMBINED CONTROL SIGNALS TO PROVIDE HIGH SPEED TRANSFER, AND SEMICONDUCTOR MEMORY FOR CARRYING OUT THE METHOD

The invention relates to a method for data transfer between a plurality of memory cells and at least one input/output terminal of a semiconductor memory in which a memory cell address is defined by a control signal for a data transfer, as well as to a semiconductor memory for carrying out the method having means for addressing and means for defining the memory cells, and means for controlling a data transfer from and to the memory cells.

Increasing memory densities of integrated semiconductor memories and increasing data word widths, require data transfer from and to the memory cells to be made at the highest possible speed. Typical semiconductor memories are organized in matrix arrays. Each individual memory cell is defined by word lines and bit lines. Access to such a memory cell is provided by applying an address that is assigned to the memory cell to the semiconductor memory, along with row address strobe signals (RAS) and column address strobe signals (CAS). Typically, the row or word address of the memory cell is addressed and selected with the RAS signal. Subsequently, the column address is validated with the CAS signal, and the memory cell is thus defined.

The prior art discloses various functional modes for memory cell access, such as the so-called page mode or the nibble mode. In the page mode, the rows are typically selected with memory cells along a word line, and according to that method a new access to selective column addresses can be provided with one of the two clock edges of the column address strobe signal CAS. Since only the row addresses need to be changed for an individual cell access in that mode, there is a speed advantage as compared with the mode in which the column and row addresses are redefined at random.

As compared with the page mode, the nibble mode represents a considerable increase in the data transfer rate. In the nibble mode described in U.S. Pat. No. 4,344,156, access to four memory cells is made with one address definition. The four memory cells prove to be the possible combination of two address indices of the defined address. The four memory cells, that are addressed with one defined address, output their stored data to buffer memories, from which the data are carried to the outside, to the input/output terminal or terminals of the semiconductor memory.

Typically, a trailing CAS signal edge defines the column address for the nibble pulse, that is for the reading out or writing in of four bits in four memory cells, while a new access to memory cells takes place at an RAS edge. As in the page mode, the corresponding first column address is typically adopted at the leading CAS edge, and the data are taken from that column address or memory cell with the trailing CAS edge. In the nibble mode, no new change of address is required for the next three memory cell accesses, so that essentially it is unnecessary to define them.

Another option for increasing the data rate is known from a publication by K. Numata et al entitled "New Nibbled-Page Architecture for High-Density DRAMs", in IEEE Journal of Solid-State Circuits, Volume 24, No. 4, August 1989, pp. 900-904. In that nibbled-page architecture, access to memory addresses in units of eight bits can be performed along the selected word line or memory cell. Access to the eight bits of each unit is performed by defining an address. After the first address is defined and the data of the stored cell information has been output, the data of the memory cells assigned to the first address are read out upon each next negative edge of the CAS signal, with the edges following one another at short intervals. The same is true for a reading cycle. Control of the data output or input is performed with the aid of the CAS signal and the write-enable (WE) signal. Internally, the memory cells assigned to the eight bits are divided into two cell regions, each of which is assigned 4-bit-wide data registers. To this extent, this is a double nibble mode of the known type. The disadvantage of such fast access is that a memory module which is constructed in that way can be used only for that cyclic access, and other operating modes cannot be implemented, or can only be implemented with difficulty.

U.S. Pat. No. 4,758,995 discloses a method for data transfer with which eight bits can also be read out in succession with one address definition. After the address has been taken over and the first readout of the associated memory cell, seven more bits are read out in succession from two memory cell regions. A counter controls the data output in such a way that the next four memory cells can be addressed and read out in sufficient time before the end of the readout of the first memory cells. The same is true for writing. That method can also be considered to be a fast-nibble cycle, which is usable only for a module of that type.

It is accordingly an object of the invention to provide a method for access to a semiconductor memory and for data transfer for a semiconductor memory and a semiconductor memory for carrying out the methods, which overcome the hereinafore-mentioned disadvantages of the heretofore-known methods and devices of this general type and with which fast access to memory cells is possible without subjecting the semiconductor memory to substantial restrictions in terms of its basic functions.

With the foregoing and other objects in view there is provided, in accordance with the invention, in a method for data transfer between a plurality of memory cells and at least one input/output terminal of a semiconductor memory, in which a memory cell address is defined by a control signal for a data transfer, the improvement which comprises controlling a data transfer operation from or to the memory cells with an address control signal and an output enable control signal for defining a memory cell address with one of the two signals; subsequently initiating a data transfer operation at a given logical linkage of the two control signals; and controlling an ensuing data transfer with the other of the two control signals.

In accordance with another mode of the invention, there is provided a method which comprises carrying out one data access to a plurality of memory cells upon each defined memory cell address.

In accordance with a further mode of the invention, there is provided a method which comprises defining the memory cell address with one signal edge of the address control signal, and controlling the data transfer with one signal edge of the output enable control signal.

In accordance with an added mode of the invention, there is provided a method which comprises defining the memory cell address with each signal edge of the address control signal, and controlling the data transfer with each signal edge of the output enable control signal.

In accordance with an additional mode of the invention, there is provided a method which comprises terminating a data transfer operation associated with the defined memory cell address, with one pulse edge of the address control signal.

With the objects of the invention in view, there is also provided in a semiconductor memory having a plurality of memory cells and at least one input/output terminal, including means for addressing and means for defining the memory cells, and means for controlling a data transfer from and to the memory cells, the improvement comprising means for jointly controlling a data transfer operation with an address control signal and an output enable control signal, means for defining the memory cell address with one of the two signals, and means for controlling the data transfer with the other of the two signals, for initiating the data transfer operation at a given logical linkage of the two control signals.

In accordance with another feature of the invention, the means for addressing the memory cells access a plurality of memory cells with each defined memory cell address.

In accordance with a further feature of the invention, the address control signal defines the memory cell address, and the output enable control signal controls the data transfer with one of its two signal edges at a time.

In accordance with an added feature of the invention, the address control signal defines the memory cell address, and the output enable control signal controls the data transfer with each of its signal edges.

In accordance with a concomitant feature of the invention, the data transfer operation associated with a defined memory cell address can be interrupted with one clock edge of the address control signal.

An advantage of the invention is that of enabling a high data transfer rate from and to the memory cells without substantially impairing the standardized basic functions for semiconductor memories in alternative operating modes. In order to control the data transfer, the address strobe signal CAS and an output enable control signal OE are used. The output enable signal can be applied to the semiconductor memory through an external connection pin, which is a standard provision in semiconductor memories having more than four megabits of memory capacity and with an x4 organization. According to internationally accepted specifications, the data output and input are switched to a tri-state condition, as long as there are no data present to be transferred. Other features which are considered as characteristic for the invention are set forth in the appended claims.

Although the invention is illustrated and described herein as embodied in a method for data transfer for a semiconductor memory and a semiconductor memory for carrying out the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
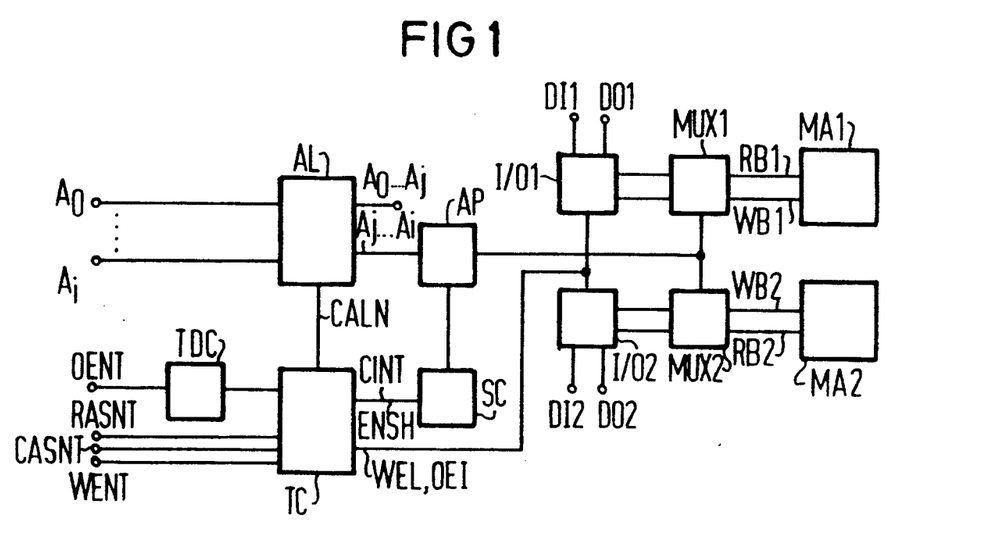
FIG. 1 is a block circuit diagram of a device used to explain the invention.

Referring now in detail to the figures of the drawing, in which identical reference numerals pertain to identical elements, and first, particularly, to FIG. 1 thereof, there is seen a block circuit diagram of a configuration that has a nibbled-page mode, which is used to explain the method according to the invention, as an exemplary embodiment. The condition that is set according to the stated object of the invention, which is that the basic functions of the memory be impaired as little as possible by the method and the corresponding configuration according to the invention, is assured by providing that a standard cycle is not varied. In other words, access to a memory cell defined according to its address is performed with an RAS or CAS signal.

In the present application, "RAS and CAS signals" refer to signals in the form in which they are applied from outside to the connection pins of the memory. This means that typically TTL signals RAS, CAS, WE and OE are applied to the pins in their negated form. This is indicated by reference symbols RASNT, CASNT, WENT and OENT. In FIG. 1, these four signals form input control signals for the semiconductor memory. The address of a memory cell is defined by the signals RASNT and CASNT; the signal WENT defines whether the memory is to be read or written, and the signal OENT typically enables an output buffer for data output. In known memories, the data input is not defined by a separate control signal.

The fundamental concept of the invention is based on the fact that as in known memories, a memory cell is addressed with an RAS or CAS signal, and the address is adopted upon a trailing CAS signal edge. As already explained, a rapid succession of such primary pulses is impossible, especially because the address adoption takes a comparatively long time. The invention accordingly provides that between two main pulses defined by the signals RAS and CAS, additional data can be read out. To this end, control signals are generated with the aid of the signals CASNT and OENT. In the case of a nibbled-page mode, the main pulse corresponds to that of the page mode, which forms a nibble mode with three additional data pulses after each main pulse. In this way, the known nibble and page or fast-page DRAM modes can be combined with one another. Further combinations are also possible, such as write per bit. In principle, the corresponding standard functions are not impaired.

Since the data transfer is to be controlled with the signals CASNT and OENT applied to the external pins, there are two basic options for this control. First, the actual data transfer can be controlled with the signal CASNT, and second it can be controlled with the signal OENT. Despite the fast data transfer, controlling the data transfer with the signal CASNT has a disadvantage which is that adoption of a new column address in accordance with the CAS signal is possible only at certain nibble pulses. Moreover, since the data output bus cannot be switched to a tri-state condition through the CAS signal, this tri-state condition must be definable with the signal OENT. If the requirement for compatibility with the known operating modes is eliminated, then the data output bus can also be operated without the tri-state transition.

Although control of the data transfer with the signal OENT has a disadvantage which is that a connection pin for the output enable signal must be provided even with a memory with x1 organization and with a memory capacity $\leq 4$ megabits, it also has a advantage which is that in fast data transfer it is possible to adopt a new column address at any time, since the CAS signal is typically used to define a memory cell. With the signal CASNT, an ongoing nibble sequence can then be interrupted and an address adopted for the new nibble cycle.

This second case, in which the address control signal CASNT defines the memory cell address and the output enable signal OENT controls the data transfer, will be explained below in conjunction with FIG. 1. The situation will be discussed in which, according to a feature of the invention, in order to further increase the data transfer rate, not merely one of the two signal edges of the signal OENT but rather each of the two signal edges of the signal OENT writes in or reads out a datum. The first datum of each nibble sequence is written into or read out of the applicable memory cell whenever, after adoption of an address with the negative edge of the signal CASNT, the address is defined and a data input or data output is initiated. This means that a data readout or data writing operation can begin whenever the signal CASNT and the signal OENT are both logical 0. In order to provide data transfer, in other words reading or writing of data, control by the OENT signal is then provided, while the CASNT signal remains at logical 0 until a new address is intended to be adopted.

In order to control the flow of the method of the invention, a time control circuit TC is provided in FIG. 1, to which the signals RASNT, CASNT and WENT are delivered directly as input signals. The enable control signal OENT that is jointly decisive according to the invention communicates with the time control circuit TC through a circuit for data transfer recognition TDC. The circuit TC is connected to an address latch circuit AL, at which address signals $A_0$–$A_i$ are present.

Since the nibble mode is typically understood to include a set of four data, the four associated memory cells can be defined with the aid of two address indices. However, the invention is not limited to transferring a nibble mode with four data between two main pulses and as needed, more data, for instance 8 or 16 data, can be transferred in a modified nibble mode. FIG. 1 indicates that addresses $A_j$–$A_i$ are delivered to an address pointer AP. The other addresses $A_0$–$A_j$, although not shown, are delivered to corresponding decoders, optionally with the interposition of other function groups, which are of no interest herein. The task of the address pointer AP is to control the actual nibble mode. The address pointer AP and the time control circuit TC communicate with one another through a shift control circuit SC. In terms of the actual memory cell array, the address pointer AP communicates with a multiplexer MUX1, which is located between an actual memory cell array MA1 and an input/output circuit I/O1. This kind of memory cell array MA1 can be divided up into a plurality of memory cell blocks, each having various memory cell fields. The memory cell array MA1 is connected to the input/output circuit I/O1 through a read bus RB1 and a write bus WB1 and the multiplexer MUX1. The input/output circuit is connected to respective externally accessible connection pins DI1 and DO1, which naturally can also be constructed as a single terminal for data input and data output. The memory cell array, the multiplexer and the input/output circuit can also be redundant, such as double or quadruple, as shown in FIG. 1. In such a case, the various connections and controls are equivalent. For instance, in FIG. 1, multiplexers MUX1 and MUX2 are connected to actual memory cell arrays MA1 and MA2 over buses RB1, WB1 and RB2, WB2 and are also connected to the address pointer AP. Through a separate write control and enablement of the data output bus or data output terminal, input/output circuits I/O1 and I/O2 are connected to the time control circuit TC.

The signals shown in FIG. 1 but not yet explained will be described below in conjunction with the other drawing figures. Terminals and signals as well as lines connected to the terminals and signals carried over the lines are also identified by the same reference numerals, in order to simplify the description.

Since the data transfer control is effected with the signals CASNT and OENT, it is readily apparent that with entirely equivalent modification of the remaining circuitry, the circuit TDC, for instance, can also be connected between the connection pin for the signal CASNT and the time control circuit TC, while in that case the signal OENT would be directly delivered to the time control circuit. It is readily apparent to one skilled in the art that the invention is not limited merely to the exemplary embodiment. Through the use of his or her own professional competence, one of skill in the art will be capable of providing other exemplary embodiments by applying the teaching of the invention.

Figure 2:
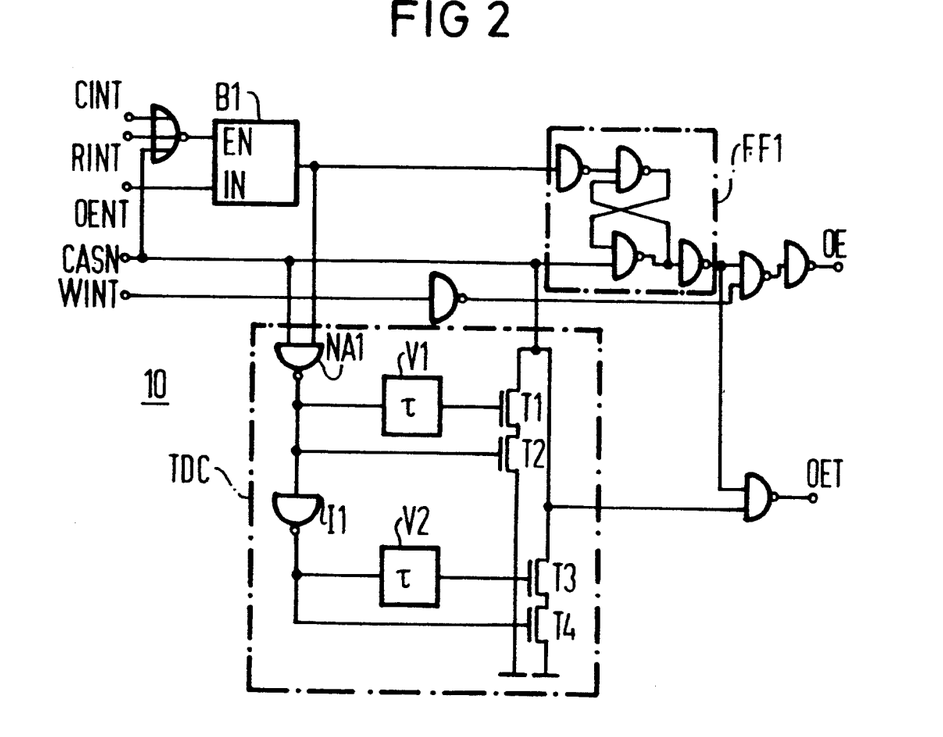
FIG. 2 is a basic circuit diagram of a device for generating internal control signals from an output enable control signal.

FIG. 2 shows a circuit 10 that includes the circuit TDC for recognizing the signal transfer at this signal OENT. The input signal of the circuit is the signal OENT, having a TTL CMOS level that is applied to an external connection pin of the semiconductor memory. This signal is converted to internal signal levels in a buffer B1. The buffer B1 is enabled with the aid of internally generated control signals, which are derived from external control signals. The generation of these internal control signals CINT, RINT and CASN will be explained below. The output of the buffer B1 is stored until the next signal transfer in each case, with the aid of a flip-flop. An internal signal OE is present at an output of a flip-flop FF1.

The circuit TDC is controlled by the output signal of the buffer B1 or in other words by the input signal OENT and by the internal control signal CASN. Both signals are linked together in a NAND gate NA1. The output signal of this gate NA1 is used once in delayed form by a delay element V1 and once in undelayed form to trigger two transistors T1 and T2. The output signal of the gate NA1 is also inverted with the aid of an inverter I1, having an output signal which is used in the same way, once delayed by a delay element V2 and once undelayed, to trigger two transistors T3 and T4. The two groups of transistors form an interconnected OR linkage. The output of this linkage forms one input of a further unlabeled NAND gate, having another input which is formed by the signal OE. On the output side of this gate, a signal OET is available, which is provided for triggering the internal control signal CINT to be generated. For the sake of completeness it will be noted that the flip-flop FF can be reset by the internal control signal CASN. The internal signal WINT serves to shut off of the data output or the signal OE.

Figure 3:
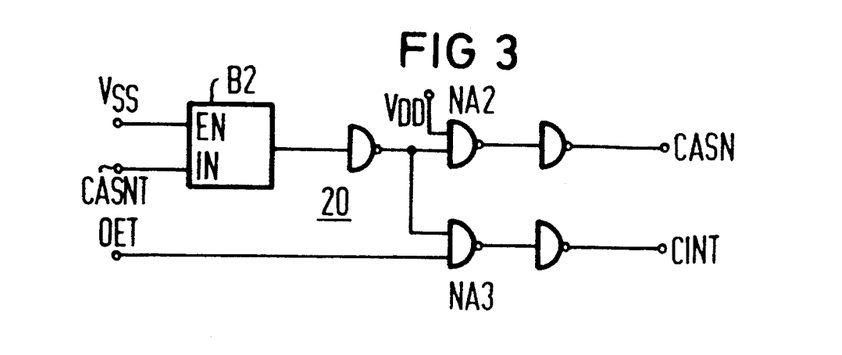
FIG. 3 is a basic circuit diagram of a device for generating internal address control signals.

FIG. 3 shows a circuit 20 for the generation of the internal column address strobe signal CASN from the external TTL signal CASNT. The external signal is delivered to a buffer B2, which converts the signal to internal voltage level signals and furnishes it as an internal signal CASN at the output of some further logical elements including a NAND gate NA2 that are not of substantial importance to the invention. At the same time, FIG. 3 shows the generation of the internal control signal CINT, which is of substantial importance to the invention, from the signal OET and from the control signal CASNT. After the buffer B2, the signal corresponding to the signal CASNT is logically linked with a NAND gate NA3, in order to generate the internal control signal CINT. This internal control signal CINT is a definitive signal for controlling the data transfer. As will become clear from the generation of this signal in FIGS. 2 and 3, the signal CINT represents a single-pulse signal, in which one pulse is generated each time the signal CASN assumes a predetermined logic state and a signal change of a logic state of the signal OENT takes place.

Figure 12:
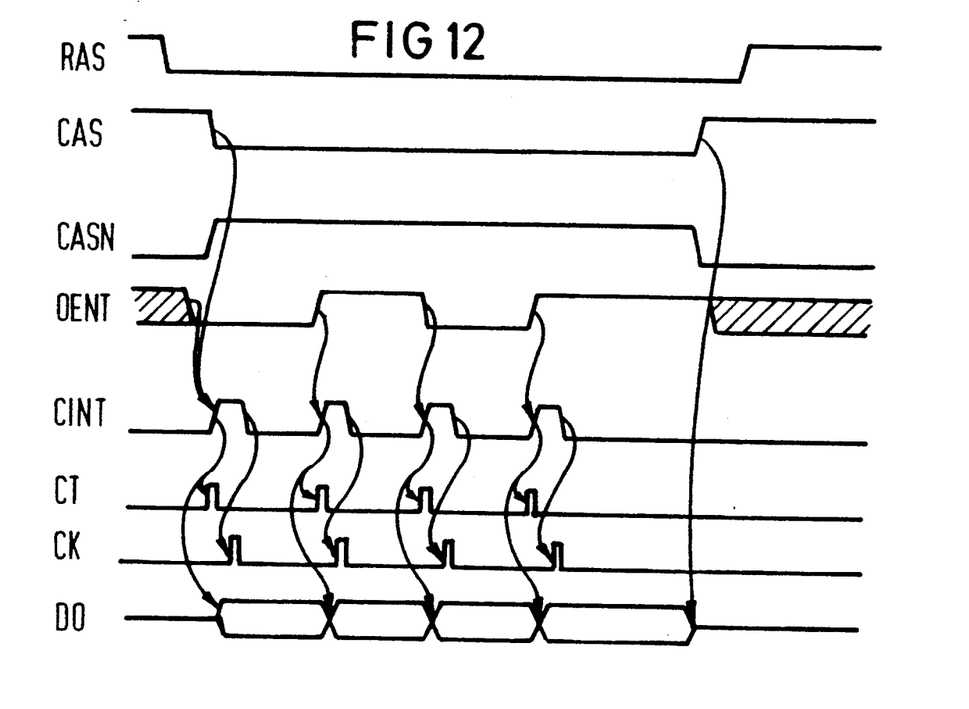
FIG. 12 is a signal diagram used to explain the method according to the invention in a reading cycle.

This connection will be described below in conjunction with FIG. 12. When a word line is selected with the signal RAS, and the column address strobe signal CAS enables a memory cell access, the first pulse of the signal CINT is generated as soon as not only the signal CAS but also the signal OENT is logical zero. The conjunctive linkage of these logic conditions is therefore necessary for generating the CINT pulse for the first time. Upon each successive signal change of the logic state of the signal OENT, a further pulse of the signal CINT is generated. One of the two signal edges of the signal CINT at a time then control the data transfer. The data are present until, upon the definitive edge of the signal CINT, the next datum is adopted or the cycle is broken with the aid of the signal CAS.

The basic concept of the invention is clear from the figures described thus far. Since the data transfer for the semiconductor memory cannot be toggled fast enough with external signals, because of the necessary adoption and definition of memory cell addresses, internal control pulses CINT are generated, which are controlled by external column address strobe signals CAS in combination with the external OENT signals. In this way, a standard function of the internal control, that is already known thus far, becomes overriding. The internal control with the aid of the signal CINT is not subject to the time limitations of the signal CAS and makes the fast data transfer possible.

Figure 4:
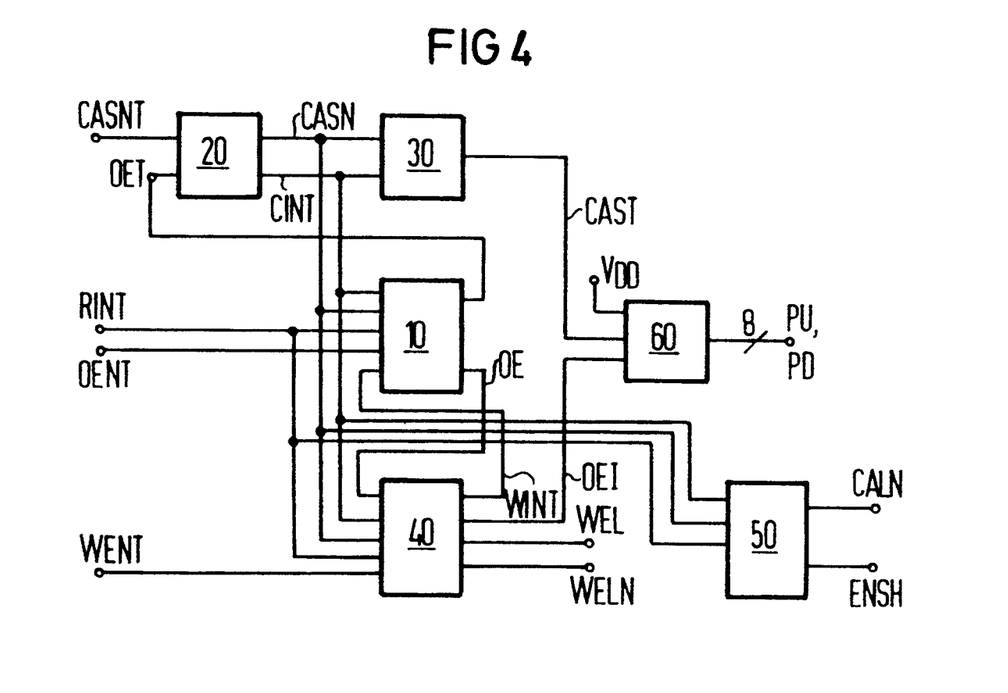
FIG. 4 is a basic circuit diagram of a device for explaining a nibbled-page mode.

FIG. 4 shows further details for achieving a nibbled-page mode according to FIG. 1. The circuits 10 and 20 have already been explained in conjunction with FIGS. 2 and 3. It should be noted that the signal RINT is generated from the signal RASNT by conversion of the external signal levels to internal signal levels with the aid of a buffer. From the internal signals CASN and CINT, a circuit 30 generates an output signal CAST, which serves to control the data bus. A circuit 60 connects the internal data bus with the output stage. A circuit 40 includes the write control, which generates an internal signal WINT from the external signal WENT and also generates a control signal OEI for the bus control module 60 and the write control signal WEL (write enable latch), or its inverted signal WELN. A circuit 50 generates control signals for the address latch AL and the address pointer AP. As can be seen, along with the signal WINT, the internal signals RINT, CASN and CINT are the definitive signals for controlling the entire data transfer.

Figure 5:
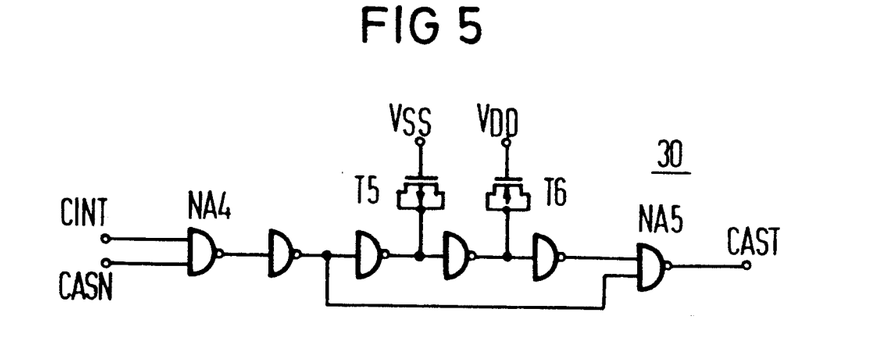
FIG. 5 is a basic circuit diagram of a device for generating an internal signal for output control.

FIG. 5 is a detailed circuit diagram of the circuit 30 for generating the signal CAST. The two control signals CINT and CASN are logically linked with one another in a gate NA4 and then delivered, once delayed through gates connected to transistors T5 and T6 and once undelayed, to a further gate NA5, having an output signal which is the signal CAST. The circuit of FIG. 5 serves to select only a single signal edge of the signal CINT as the effective edge.

Figure 6:
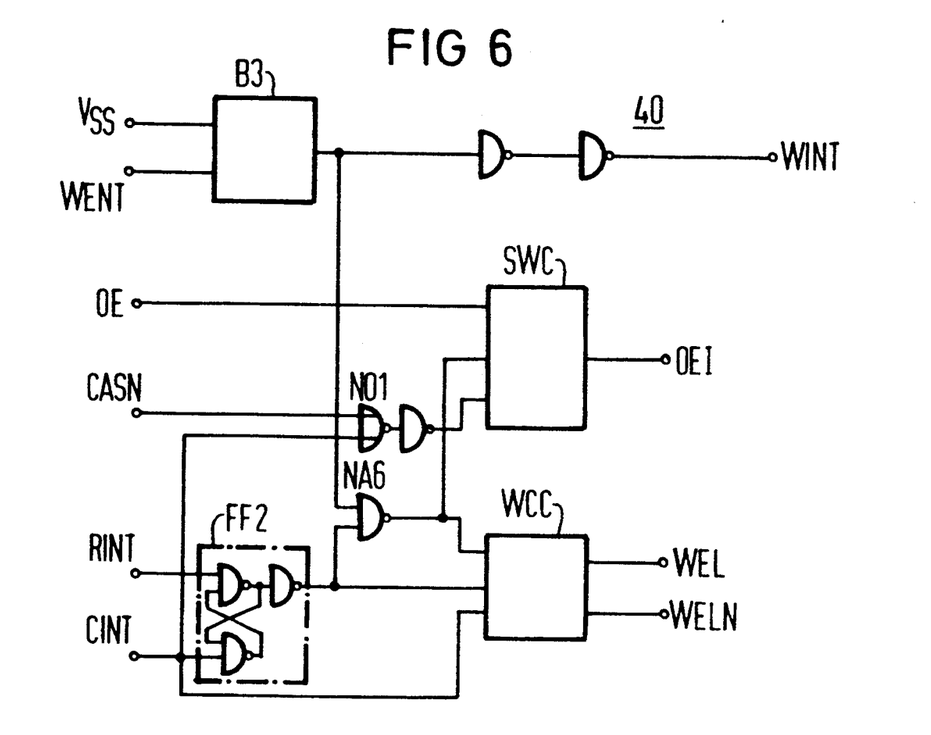
FIG. 6 is a basic circuit diagram of a device for generating internal write control signals.

FIG. 6 shows the write control circuit 40. The external write control signal WENT is converted by a buffer B3 into the internal signal WINT. The output signal of the buffer B3 serves along with the signals RINT and CINT that pass through a flip-flop FF2 and a NAND gate NA6 to control an actual write control circuit WCC, which generates the write control signals. It is readily possible for one skilled in the art to construct the circuit WCC. The output signal of the buffer B3 also serves to control a circuit SWC, which generates the signal OEI that is responsible for controlling the data bus as a function of the write enable signal. A NOR gate NO1 connects the signals CASN and CINT to the circuit SWC.

Figure 7:
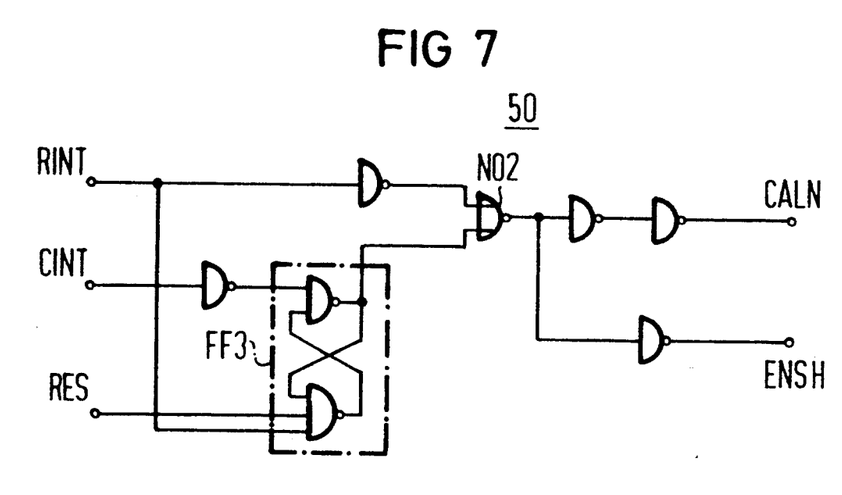
FIG. 7 is a basic circuit diagram of a device for generating address control signals.

FIG. 7 shows the circuit 50, which serves to generate address control signals CALN and ENSH. The signals RINT and CINT are logically linked with one another in a NOR gate NO2 and generate the signal CALN, which controls the address latch circuit AL, and the control circuit ENSH, which is inverted with respect to the signal CALN and which controls the shift control circuit SC, that in turn defines a nibble sequence with the aid of the address pointer AP. A signal RES for a flip-flop FF3 is a reset signal, which is dependent on internal control signals.

Figure 8:
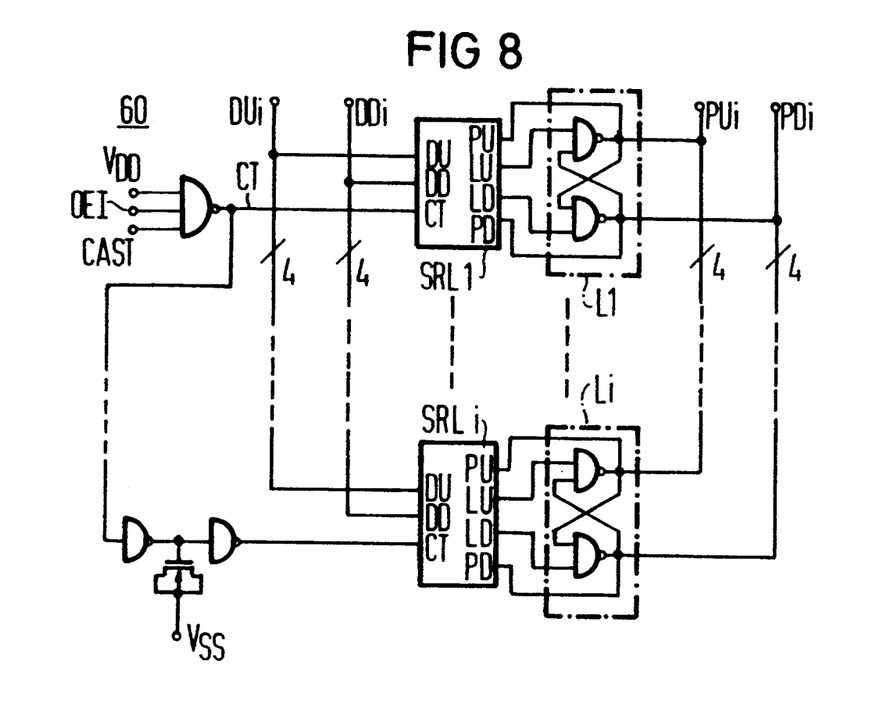
FIG. 8 is a basic circuit diagram of an output control circuit.

FIG. 8 shows the circuit 60, which includes a control of an internal data bus DUi or DDi to an external bus PUi or PDi. The buses in the exemplary embodiment each include four data lines, for data up, data down, pull up and pull down. The internal data bus is precharged to logical HIGH. The signal CAST, which is selected in accordance with an effective edge of the signal CINT, and the signal OEI are logically linked with one another to make a signal CT. This signal CT, along with the data bus, serves as an input signal for set/reset latch elements SRL1-SRLi. The number of these latches corresponds to the number of I/O groups and thus of data line groups, or in other words four in the exemplary embodiment. The signal OEI depends on whether an early write state is present, in which the effective edge of the signal WENT is present before the effective edge of the signal CASNT. In that case, the input/output lines are in a tri-state condition, so that a data input or output is not allowed. Conversely, if the effective edge of a write enable signal occurs after the effective edge of the signal CASNT, then the data input and output are enabled.

If the signal CT is at logical HIGH potential, then input signals for output latches L1-Li at connections LU and LD are at logical LOW potential, and correspondingly the lines of the bus PUi and PDi are at logical HIGH potential or in other words in a tri-state condition. If the signal CT is at logical LOW potential, then upon a signal change of a data bus DU or DD, one of the latches SRLi or Li can be set and thus the data signal transferred to the output bus. The next effective edge of the signal CINT then enables a new data adoption from the internal data bus DU and DD into the latches.

Figure 9A:
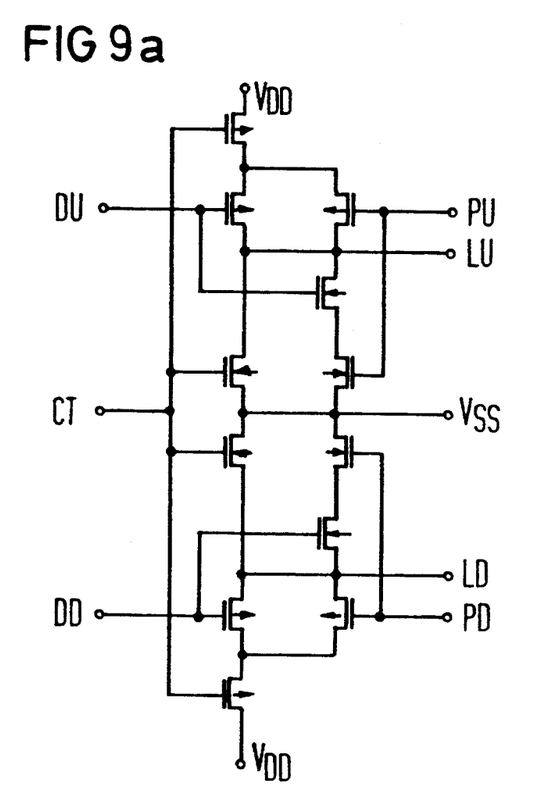
FIG. 9a is a basic circuit diagram of a latch circuit of the output control circuit.
Figure 9B:
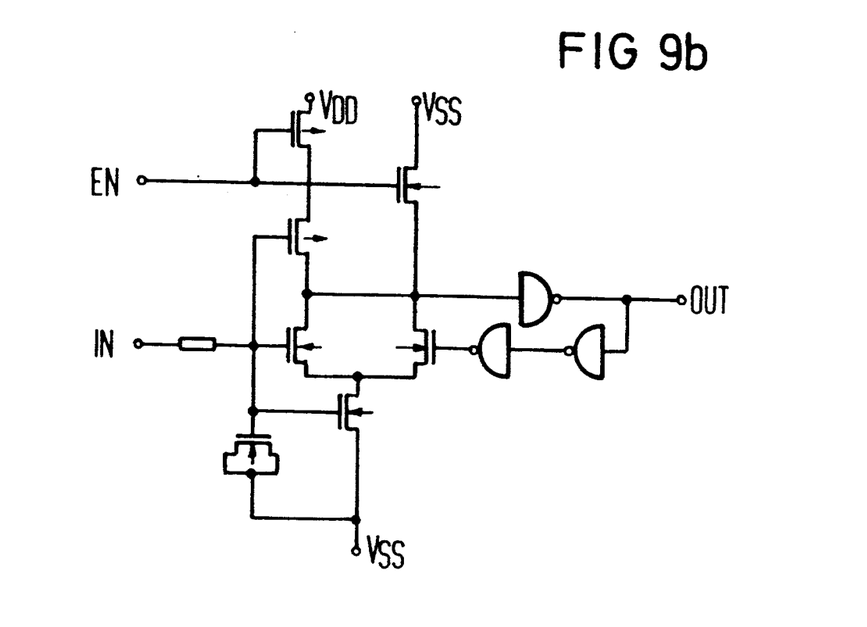
FIG. 9b is a basic circuit diagram of a buffer circuit.

FIG. 9a shows a more detailed circuit diagram of the set/reset latch SRLi. FIG. 9b shows a more detailed circuit diagram of an address latch.

Figure 10:
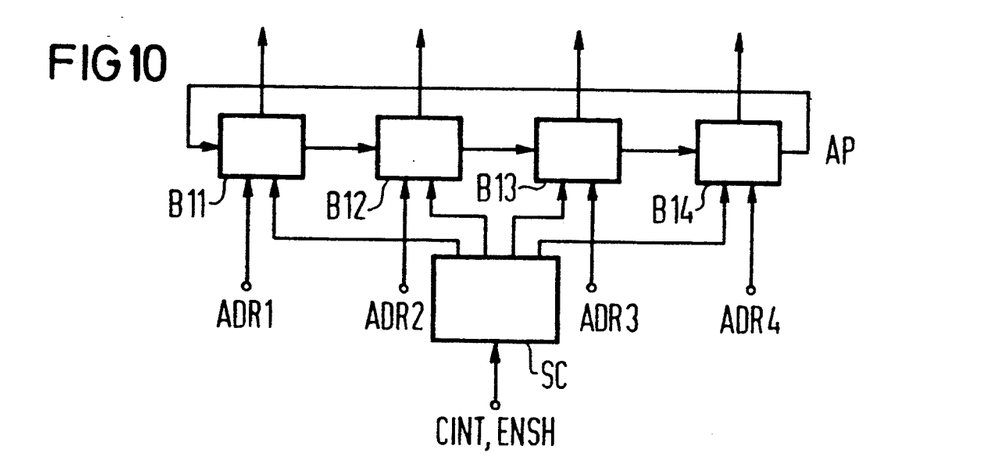
FIG. 10 is a basic circuit diagram of a device for explaining the nibble mode with the signals according to the invention.

FIG. 10 shows a block circuit diagram which is used to explain the nibble mode of the prior art. Addresses ADR1-ADR4 belonging to one nibble sequence are present at buffers B11-B14 of the address pointer AP. These buffers are connected to one another in a ring circuit. The shift control circuit SC is controlled by the signals CINT and ENSH and sends control signals to the buffers. In a nibble sequence, the four associated memory cells are either simultaneously written first into a buffer memory and then in accordance with a ring control through the buffers that are read out directly in succession, or the individual memory cells are written upon directly in succession and the data are output.

Figure 11:
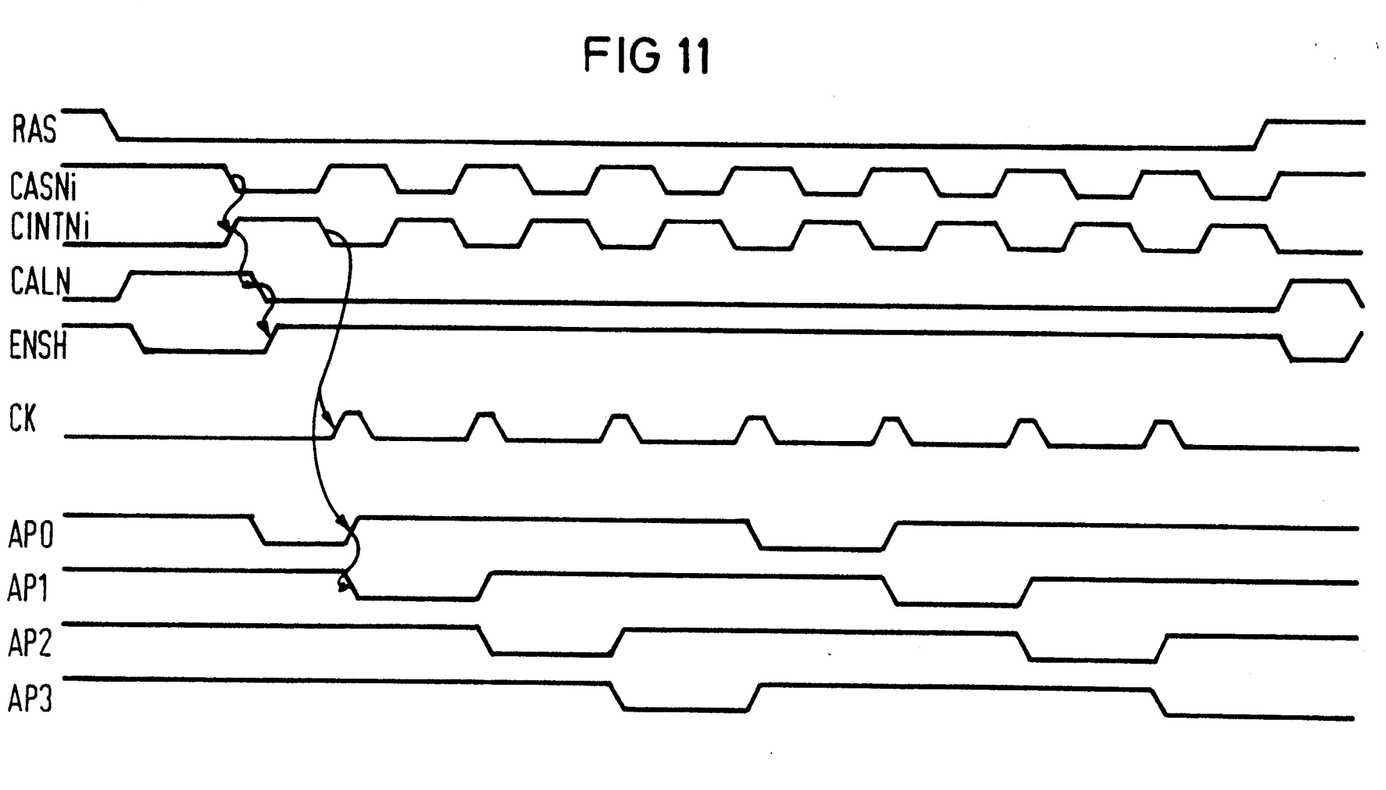
FIG. 11 is a signal diagram used to explain the nibbled-page mode.

The signal diagram of FIG. 11 explains this known nibble mode. Upon a trailing signal edge of a signal CASNi, in the mode described, an address pointer APi is set with the aid of signals CINTNi and ENSH, and upon the trailing signal edge of the signal CINTNi, a clock signal CK is generated, and the previously set address pointer is reset and the next address pointer is set. This process occurs four times per nibble sequence. According to the invention, this process can be continued cyclically for an arbitrary length of time.

Figure 13:
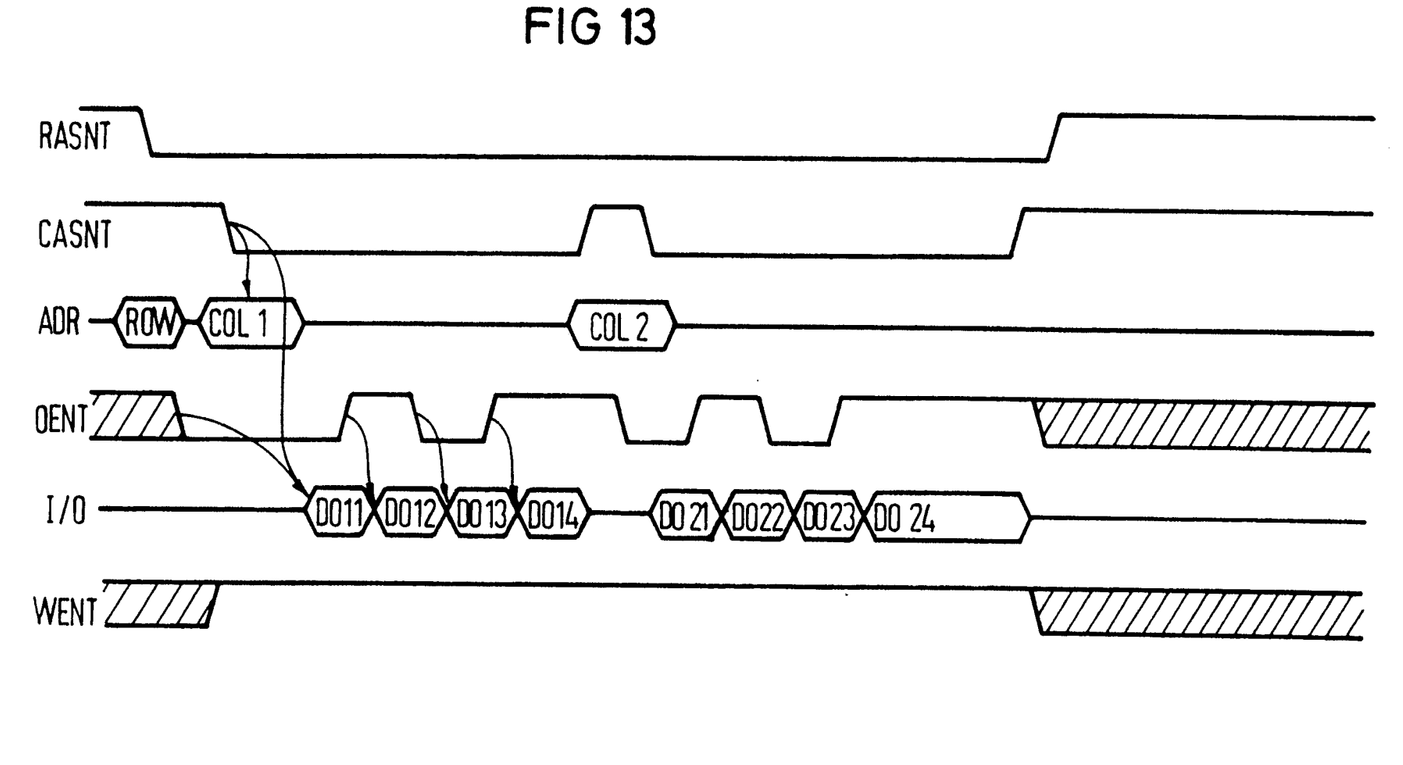
FIG. 13 is a signal diagram used to explain a nibbled-page mode in a reading cycle.

FIG. 13 shows a signal diagram for a reading cycle in the nibbled-page mode, which is controlled by signal transitions of the output enable signal OE. Upon the trailing signal edge of the signal CAS, the first column address is adopted, or since the signal OE is already at logical LOW potential, the corresponding memory cell is defined and simultaneously the input/output circuit is enabled. The two trailing signal edges of the signals CAS and OE initiate the reading operation. Both edges are conjunctively linked together and in this case, the first reading operation for DO11 is controlled by the negative edge of the signal CAS. The three following data are each controlled by one edge of the signal OE. After this nibble sequence has elapsed, the next column address COL2 is adopted upon the leading edge of the signal CAS, and the associated data of one nibble sequence are read out upon the next trailing edge. The signal CAS thus controls the page mode, while the nibble mode in each page interval is controlled with the signal OE.

Figure 14:
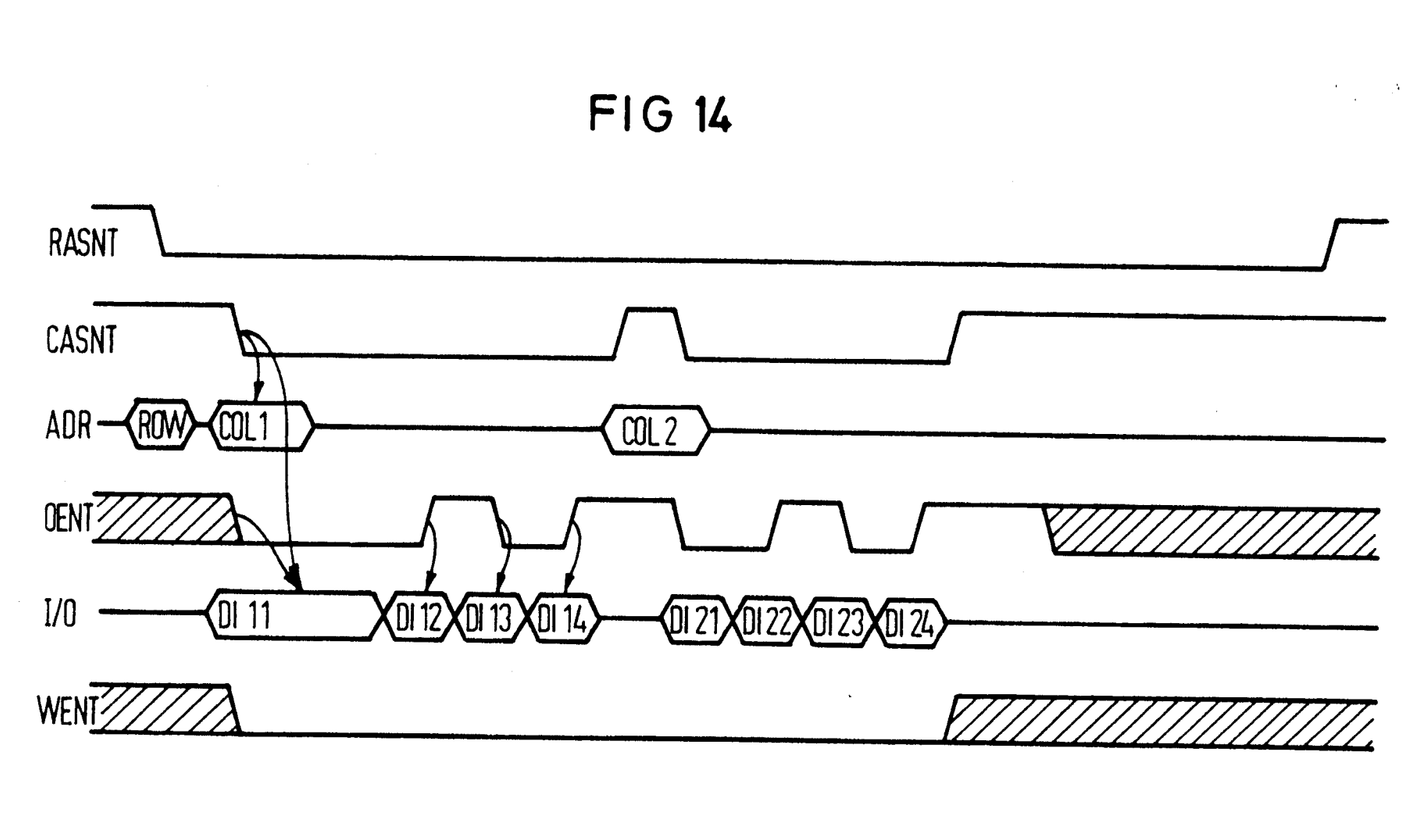
FIG. 14 is a signal diagram used to explain a nibbled-page mode in a writing cycle.

The writing cycle of FIG. 14 proceeds analogously to what has been described for FIG. 13.

It is readily apparent from FIGS. 13 and 14 that by controlling the page mode with the signal CAS and the nibble mode with each signal edge of the signal OE, the data transfer rate can be doubled automatically. A single nibble mode has been selected in the exemplary embodiment, but data transfers with 8, 16 or more nibbles on each page are also possible. This would be the equivalent of two, four, or more nibble sequences.

An advantage of the method and of the memory according to the invention are that the signal CAS can be used in its standardized specification for its original determination as a column address strobe signal, and also for breaking the serial data current, by putting the data output in a tri-state condition. Naturally, the mode described can be adopted without difficulty to an x4 organization, and a combination with a write per bit function is also possible without difficulty. Further embodiments of the concept of the invention will be readily understood by one skilled in the art. A serial page mode that is controlled by the signal OE is naturally also possible. One of two signal edges of the OE signal is always definitive in that case. An increased page length with an increased data rate is then obtained, in which the serial data cycle can be interrupted by the CAS signal. As in the exemplary embodiment described, the signal CAS controls the column address adoption, and the data output is controlled by the signal OE. On the other hand, the serial page mode in which the data transfer is controlled by the signal CAS itself is also possible. The tri-state condition of the data output is then set by the signal OE. In this version, a standard-page mode is not possible, since the data transfer is controlled by the signal CAS and thus an address adoption can take place only at certain times, or in other words after a certain number of CAS signal changes. A counter is suitably provided for that purpose. It is also possible to recognize an address change upon an interruption of a nibble cycle. Finally, a separate pulse can be generated, with which a new address can be adopted.

We claim:

1. In a method for data transfer between a plurality of memory cells and at least one input/output terminal of a semiconductor memory, in which a first memory cell address is defined for a data transfer by an address control signal, the improvement which comprises:

controlling a data transfer operation with the address control signal and an output enable control signal by placing the address control signal in its active state and defining a first memory cell address, placing the output enable control signal in its active state, initiating the data transfer with regard to the first memory cell address after the address control signal and the output enable control signal have been placed in their active states, subsequently at least once placing the output enable control signal in its inactive state and back in its active state while maintaining the address control signal in its active state, and defining a further memory cell address each time the output enable control signal is placed back in its active state and proceeding with the data transfer with regard to the further memory cell address, and also defining a further memory cell address each time the output enable control signal is placed into its inactive state and proceeding with the data transfer with regard to the further memory cell address.

2. The method according to claim 1, which comprises terminating the data transfer by placing the address control signal into a state being opposite its active state.

3. In a method for data transfer between a plurality of memory cells and at least one input/output terminal of a semiconductor memory, in which a first memory cell address is defined for a data transfer by an address control signal, the improvement which comprises:

controlling a data transfer operation with the address control signal and an output enable control signal by placing the address control signal in its active state and defining the first memory cell address, placing the output enable control signal in its active state, initiating the data transfer with regard to the first memory cell address after the address and output enable control signals have been placed in their active states, subsequently placing the address control signal into a state being opposite its active state while maintaining the output enable control signal in its active state, and defining a further memory cell address, and proceeding with the data transfer with regard to the further memory cell address.

4. The method according to claim 3, which comprises, subsequently to placing the address control signal into the state opposite its active state, at least once placing the address control signal into its active state while maintaining the output enable control signal in its active state; defining a further memory cell address each time the address control signal changes between its active state and the state opposite the active state; and proceeding with the data transfer with regard to each of the further memory cell addresses.

5. The method according to claim 3, which comprises terminating the data transfer by placing the output enable control signal into a state being opposite its active state.

6. In a semiconductor memory having a plurality of memory cells, at least one input/output terminal, including means for addressing the memory cells, means for defining memory cell addresses, and means for controlling a data transfer between the at least one input/output terminal and the memory cells, the improvement comprising:

means for jointly controlling a data transfer operation with an address control signal and an output enable control signal, said controlling means including:

means which define a first memory cell address by placing the address control signal into an active state, means which selectively place the output enable control signal in its active state, said defining means and said selectively placing means together being means for initiating the data transfer operation with regard to said first memory cell address by placing the control signals in their active states, means for at least once placing the output enable control signal into an inactive state and back into an active state while maintaining the address control signal in an active state, after the data transfer operation has been initiated, and said defining means defining a further memory cell address each time the output enable control signal assumes its active state and proceeding with the data transfer operation with regard to the further memory cell address, and said defining means defining a further memory cell address when the output enable control signal is placed in its inactive state while the address control signal is maintained in its active state, and wherein the data transfer operation is continued with regard to the further memory cell addresses.

7. The semiconductor memory according to claim 6, including means for terminating the data transfer operation by placing the address control signal into a state which is opposite the active state.

8. In a semiconductor memory having a plurality of memory cells, at least one input/output terminal, including means for addressing the memory cells, means for defining memory cells addresses, and means for controlling a data transfer between the at least one input/output terminal and the memory cells, the improvement comprising:

means for jointly controlling a data transfer operation with an address control signal and an output enable control signal, said controlling means including:

means which define a first memory cell address by placing the address control signal into an active state, means which selectively place the output enable control signal in its active state, said defining means and said selectively placing means together being means for initiating the data transfer operation with regard to said first memory cell address by placing the control signals into the active states, said defining means defining a further memory cell address after initiation of the data transfer operation by placing the address control signal into a state which is opposite its active state while maintaining the output enable signal in its active state, and continuing the data transfer operation with regard to the further memory cell address.

9. The semiconductor memory according to claim 8, wherein said defining means place the address control signal at least once into its active state and the state opposite the active state for further continuing the data transfer operation while the output enable signal is maintained in its active state; wherein said defining means defines a further memory cell address each time the address control signal is placed into its active state and each time the address control signal is placed into the state opposite thereto; and wherein the data transfer operation is continued for each of the further defined memory cell addresses.

10. The semiconductor memory according to claim 8, including means for terminating the data transfer operation by placing the output enable control signal into a state opposite its active state.

* * * * *